United States Patent
Sun

(10) Patent No.: US 9,835,673 B2
(45) Date of Patent: Dec. 5, 2017

(54) METHOD FOR ANALYZING FAULTS IN UNGROUNDED POWER DISTRIBUTION SYSTEMS

(71) Applicant: Mitsubishi Electric Research Laboratories, Inc., Cambridge, MA (US)

(72) Inventor: Hongbo Sun, Plymouth, MN (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 823 days.

(21) Appl. No.: 13/861,446

(22) Filed: Apr. 12, 2013

(65) Prior Publication Data

US 2014/0309952 A1 Oct. 16, 2014

(51) Int. Cl.
*G01R 31/02* (2006.01)
*G01R 31/08* (2006.01)
*H02J 13/00* (2006.01)

(52) U.S. Cl.
CPC ......... *G01R 31/086* (2013.01); *G01R 31/025* (2013.01); *G01R 31/08* (2013.01); *H02J 13/001* (2013.01); *Y04S 10/40* (2013.01); *Y04S 10/522* (2013.01)

(58) Field of Classification Search
CPC .... G01R 31/086; G01R 31/025; G01R 31/08; Y04S 10/522; H02J 13/001
See application file for complete search history.

(56) References Cited

U.S. PATENT DOCUMENTS

| | | | | |
|---|---|---|---|---|
| 2002/0053912 A1* | 5/2002 | Saha | ................... | G01R 31/088 324/525 |
| 2003/0085715 A1* | 5/2003 | Lubkeman | .......... | G01R 31/086 324/509 |
| 2009/0147415 A1* | 6/2009 | Lazarovich | .............. | H02H 9/08 361/42 |
| 2010/0277181 A1* | 11/2010 | Saha | ................... | G01R 31/088 324/521 |
| 2012/0089264 A1* | 4/2012 | Patel | ........................ | H02J 3/00 700/292 |
| 2013/0346011 A1* | 12/2013 | Ou | ........................... | H02J 3/06 702/123 |

(Continued)

OTHER PUBLICATIONS

Montagna et al., A comprehensive approach to fault analysis using phase coordinates, 2002, Elsevier, pp. 101-108.*

(Continued)

*Primary Examiner* — John Breene
*Assistant Examiner* — Mohammad Islam
(74) *Attorney, Agent, or Firm* — Gene Vinokur; James McAleenan; Hironori Tsukamoto

(57) ABSTRACT

A method analyzes a fault of an ungrounded power distribution system. The method determines a type of a fault in a line segment of the ungrounded power distribution system, and modifies a nodal admittance matrix of the line segment determined before the fault using a transformation matrix corresponding to the type of the fault to produce a faulty nodal admittance matrix of the line segment after the fault. The ungrounded power distribution system is analyzed using the faulty nodal admittance matrix and nodal admittance matrices of functional branches or line segments of the power distribution system.

20 Claims, 10 Drawing Sheets

(56) References Cited

U.S. PATENT DOCUMENTS

2014/0052391 A1* 2/2014 Feng .................... G01R 31/088
  702/58
2014/0229127 A1* 8/2014 Ren ......................... H02H 3/40
  702/59

OTHER PUBLICATIONS

Zhu et al., Automated Fault Location and Diagnosis on Electric Power Distribution Feeders, Apr. 1997, IEEE pp. 801-809.*
Chen et al., Distribution System Short Circuit Analysis,1991, IEEE, pp. 22-28.*
Sun et al., Hybrid Three-Phase Load Flow Method for Ungrounded Distribution Systems, Oct. 2012, IEEE, pp. 1-8.*
Todorovski et al.Handling Three-Winding Transformers and Loads in Short Circuit Analysis by the Admittance Summation Method, Aug. 2003, IEEE, pp. 993-1000.*
Chen et al., "Distribution System Short Circuit Analysis—A Rigid Approach," IEEE Trans. on Power Systems, vol. 7, No. 1, pp. 444-450, Feb. 1992.
Zhang et al., "A Distribution Short Circuit Analysis Approach Using Hybrid Compensation Method," IEEE Trans on Power Systems, vol. 10, No. 4, pp. 2053-2059, Nov. 1995.
Montagna, et al. "A Comprehensive Approach to Fault Analysis using Phase Coordinates," Electric Power Systems Research, Mar. 28, 2002, vol. 61, p. 101-108.

* cited by examiner

300

400

500

700

800

1000

METHOD FOR ANALYZING FAULTS IN UNGROUNDED POWER DISTRIBUTION SYSTEMS

FIELD OF THE INVENTION

The present invention relates generally to power distribution systems. More particularly, the invention relates to analyzing faults in ungrounded power distribution systems.

BACKGROUND OF THE INVENTION

Ungrounded power distribution systems are widely used, especially at medium voltage levels, e.g., less than 50 kV. Usually, the ungrounded power distribution systems use three phase three wire configuration. The windings of three-phase transformers and voltage regulators are either ungrounded WYE connected, or DELTA connected. The three-phase loads are DELTA connected.

The short-circuit fault analysis determines the three-phase voltages of buses and three-phase currents of branches of the distribution system when a fault, such as a short circuit, occurs within a line segment. The fault locations are conventionally modeled as independent buses, and the voltages and currents of the distribution systems are determined using numerical techniques. There are many techniques published for the analysis of short circuit faults, including symmetrical component methods, time simulation based methods, and phase frame based methods.

The typical phase frame based methods include nodal admittance/impedance matrix based method such as a method described by Chen et al., "Distribution System Short Circuit Analysis—A Rigid Approach," IEEE Trans. on Power Systems, Vol. 7, No. 1, pp. 444-450, February 1992, and topology based methods such as a backward and forward sweep method described by Zhang et al., "A Distribution Short Circuit Analysis Approach Using Hybrid Compensation Method," IEEE Trans on Power Systems, Vol. 10, No. 4, pp. 2053-2059, November 1995.

All those methods have limitations when applied to real time analysis of ungrounded distribution systems either in modeling accuracy, or solution efficiency.

The symmetrical component methods are designed for balanced systems, and not well suited for unbalanced systems, such as distribution systems. The time simulation methods are suitable at modeling capability and accuracy, but time consuming for practical size systems. The nodal admittance/impedance matrix based methods are suitable for modeling of most distribution systems, but have difficulties in modeling zero-impedance components, and usually take a long time to obtain solutions. The topology based methods are designed for radial distribution systems, mostly for grounded systems. The computation performance of the topology based methods is heavily impacted by the number of loops and generation sources of the distribution system.

SUMMARY OF THE INVENTION

The objective of various embodiments of the invention is to provide an efficient and accurate method for analyzing line faults in large-scale ungrounded power distribution systems.

In contrast with methods that modeled the fault location within the fault line as independent buses, some embodiments integrate the fault conditions of a line fault into a nodal admittance matrix of a line segment having the fault. By using nodal admittance matrix based methods to analyze a line fault, the system subject to faults maintains the same topology as the system under normal states. Similarly, the nodal admittance matrix of the system constructed based on the topology under normal conditions can be used to determine the nodal admittance matrix of the system under fault conditions. For example, one embodiment only modifies the elements of the nodal admittance matrix associated with the terminal buses of the faulty line.

In addition, the system under a fault can be solved with less effort and without factorization of the system admittance matrix when the factorized triangular matrices of the system constructed based on the topology of normal states are available by using numerical methods, such as matrix inversion lemma (Woodbury matrix identity). This avoids changing in the dimension of nodal admittance matrix of the system, and complexity of constructing and factorizing the nodal admittance matrix of the system under a fault, which varies in dependence of the type of the fault to be analyzed.

Some embodiments model the impacts of zero-impedance branches, such as voltage regulators by merging those branches with adjacent impedance branches, and the inaccuracy or divergence problem introduced by adding small impedance into those branches that used by conventional methods have been avoided. The ungrounded bus with non-zero neutral voltage is kept in the solution to ascertain the impacts of floating neutral of a transformer or regulation with ungrounded connection modeled accurately. Those embodiments further improved solution efficiency by integrating the three phase jointly-regulation of distribution generation sources into nodal admittance model with one internal node and three external nodes to avoid the additional coordination between three-phases.

In some embodiments, based on the fault location and topology, the distribution system is partitioned into a main network and multiple lateral networks. The main network is formed by the connected paths between the terminal buses of faulty line and generation sources, and solved by a nodal admittance matrix based method. The lateral networks are formed by one of the buses of main network and all buses and branches downstream to the bus, and solved by a backward and forward sweep method. Such partitioning can take advantage of matrix based methods for handling the regulations of generation sources, and complicated voltage inter-dependence between buses, and the computation efficiency provided by topology based method for radial systems. Thus, the partitioning and recursive analysis allows increasing efficiency of the fault analysis.

To further reduce the requirement of the iterations for a converged solution, one embodiment initializes the voltage of bus based on its corresponding control zone. The voltages of buses within fault controlled zone are set as the voltages of fault point, and the voltages of buses of generation source controlled zones are set as the source voltages multiplying by the voltage amplifying factors introduced by the regulator or transformer on the paths of generation source and the bus of interest.

Accordingly, one embodiment discloses a method for analyzing faults of an ungrounded power distribution system. The method includes determining a type of a fault in a line segment of the ungrounded power distribution system; modifying a nodal admittance matrix of the line segment determined before the fault using a transformation matrix corresponding to the type of the fault to produce a faulty nodal admittance matrix of the line segment after the fault; and analyzing the ungrounded power distribution system using the faulty nodal admittance matrix and nodal admittance matrices of functional line segments of the power distribution system. The steps of the method are performed by a processor.

Another embodiment discloses a system for performing a short-circuit fault analysis of an ungrounded power distribution system, comprising a processor for determining a faulty nodal admittance matrix of a line segment after a fault; and for analyzing the ungrounded power distribution system using the faulty nodal admittance matrix and nodal admittance matrices of functional line segments of the power distribution system.

DETAILED DESCRIPTION OF THE PREFERRED EMBODIMENTS

Figure 1:
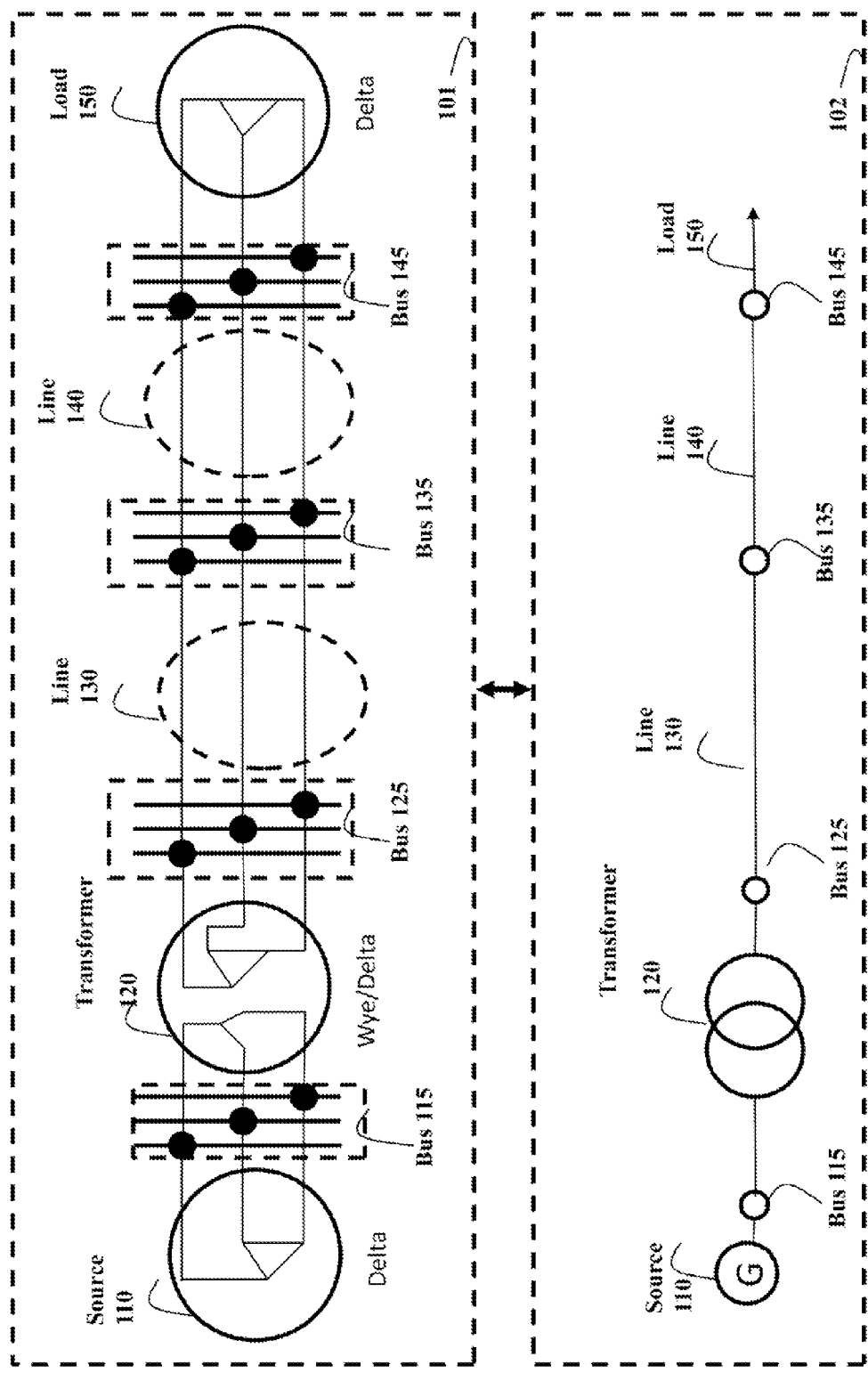
FIG. 1 is a schematic of an exemplar ungrounded distribution system.

FIG. 1 shows schematic diagrams of a sample ungrounded power distribution system including both the three-phase representation 101 and one-line diagram 102. The sample system includes one Delta-connected three-phase source 110, one three-phase transformer 120 with WYE/DELTA connection, two three-phase distribution lines 130 and 140, and one DELTA-connected three-phase load. There are four three-phase buses in the system, including bus 115, bus 125, bus 135 and bus 145.

Some embodiments of the invention are based on an observation that representing the fault within a line segment as an independent bus on an ungrounded power distribution system changes the topology of the distribution system. In addition, the new bus representing the fault has a different number of unknown phases depending on the type of the fault. Those changes and uncertainties necessitate the update and re-factorization of nodal admittance matrices of the entire power distribution system. Accordingly, a method for analyzing a line fault of an ungrounded power distribution system based on the representing the fault as the additional bus is not optimal.

Some embodiments are based on a general realization that instead of modeling the fault using an additional bus; it is advantageous to modal the fault using the nodal admittance matrix of the line having a fault, i.e., the nodal admittance matrix the faulty line. Such modeling preserves the topology of the power distribution system, because no additional buses are introduced.

Some embodiments are based on a specific realization that there is a relationship between the nodal admittance matrix of the line without fault, i.e., a functional line, and the nodal admittance matrix of the faulty line. This relationship is line dependent, which means that the modification of the nodal matrix of the line due to the fault does not affect nodal matrixes of other lines. Thus, only the nodal admittance matrix of the faulty line has is modified. The rest of the nodal admittance matrices can be preserved, which increases the computational efficiency.

The relationship between the nodal admittance matrix of the line before and after the fault can be determined based on the relationship between voltages and currents on the line before and after occurrence of the fault. Specifically, for any line there is an electrical relationship between the currents on the line and the voltages on the terminal buses of the line. That relationship is reflected in the nodal admittance matrix. The fault changes the relationship between the currents and the voltages in a predetermined manner that depends on the type of the fault. Thus, the occurrence of the fault also changes the nodal admittance matrices in the predetermined manner and also in dependence of the type of the fault. Thus, it is possible to predetermine transformation matrixes for various types of the fault and update the nodal admittance matrix of the line in response to the detection of the fault using the corresponding transformation matrixes.

Figure 2:
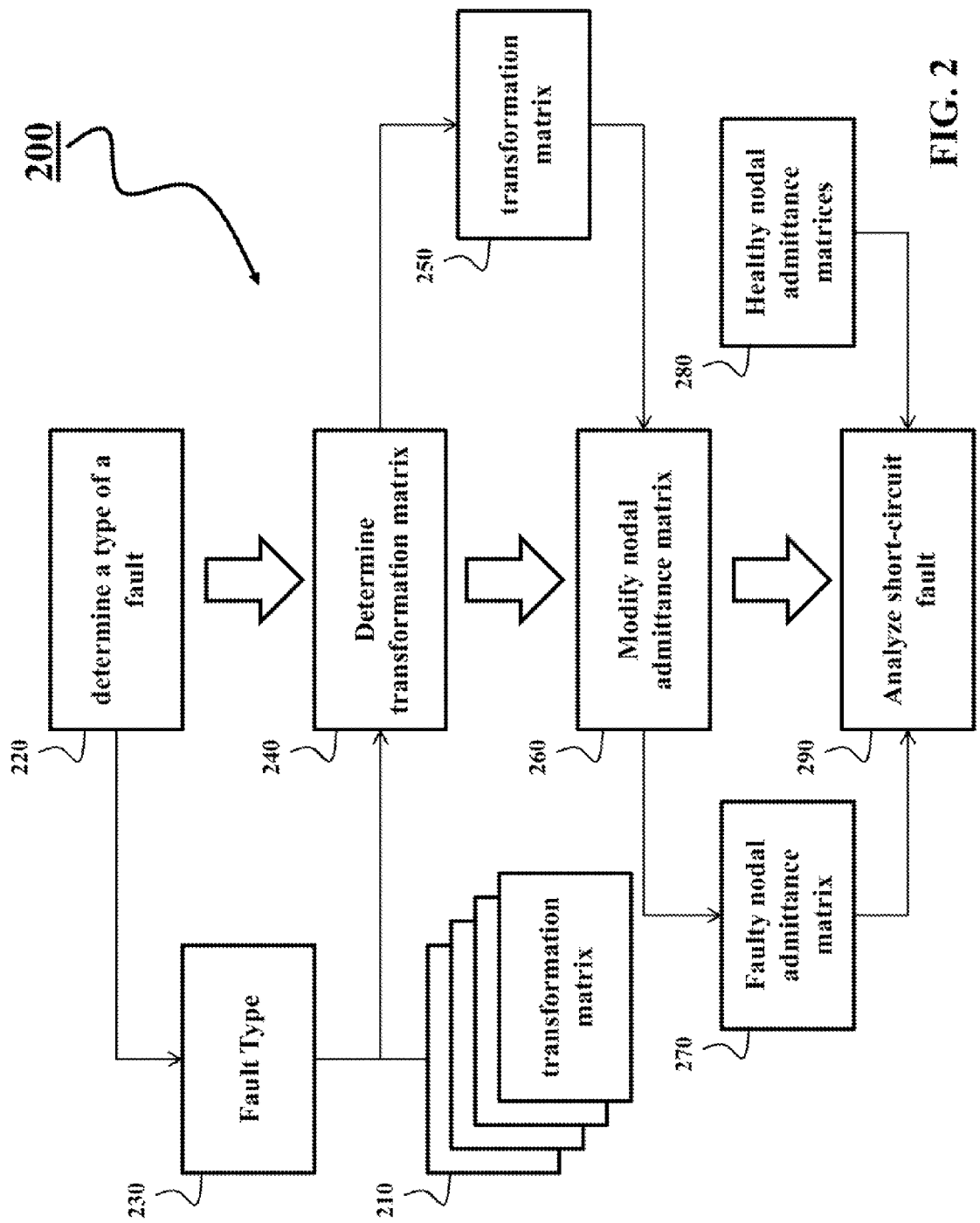
FIG. 2 is a block diagram of a method for analysis of short-circuits on line segments according to one embodiment of the invention.

FIG. 2 shows a block diagram of a method for analysis of short-circuits on a line segment in an ungrounded power distribution system according to one embodiment of the invention. The method can be implemented using a processor 200.

The method determines 220 a type 230 of a fault on a line segment and determines 240 a transformation matrix 250 based on the type 230. For example, in one embodiment, a set of transformation matrices is predetermined and stored in a memory (not shown). The embodiment selects the transformation matrix 250 from the set of transformation matrices 210 using the type 230 as a key. Additionally or alternatively, the transformation matrix 250 corresponding to the fault can be calculated in real-time in response to detecting the fault.

Next, a nodal admittance matrix of the faulty line segment before the fault is modified 260 using a transformation matrix 250 corresponding to the type of the fault to produce a faulty nodal admittance matrix 270 of the faulty line segment after the fault. The short-circuit analysis is performed 290 using nodal admittance matrices 280 of functional line segments, or branches of the power distribution system without the fault and the faulty nodal admittance matrix 270 of the faulty line segment.

Modeling of Line Faults of Power Distribution Systems

A fault may occur at any location along a line segment of a distribution system. The typical type of short circuit faults include single phase to ground fault, double phase to ground fault, three phase to ground fault, phase to phase fault, and phase to phase to phase fault. The faults can be either a bolted fault in which the faulted phase is directly connected to ground or other phase, or an impedance fault in which the faulted phase is connected with ground or other phases through impedances.

Figure 3:
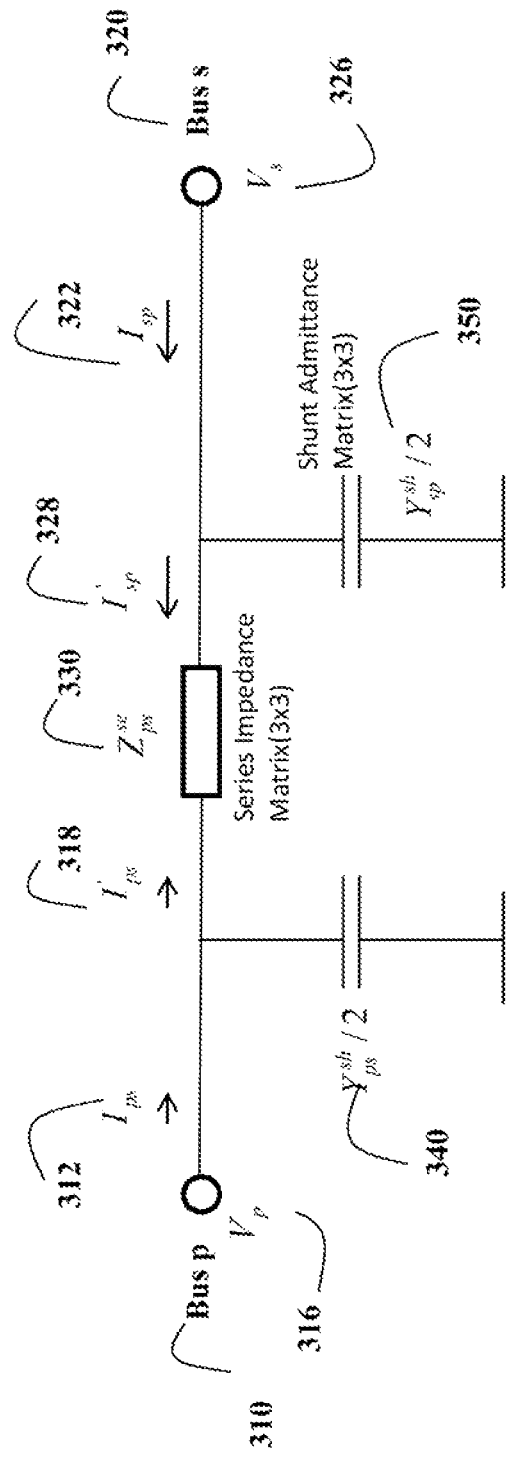
FIG. 3 is a schematic of a line segment with series impedance and shunt admittance.

FIG. 3 shows a model of a line segment 300 connecting bus p, 310 and bus s, 320. The three-phase line is described by a 3-by-3 series impedance matrix, $Z_{ps}^{se}$ 330 and a 3-by-3 shunt admittance matrix $Y_{ps}^{sh}$ split into two terminal buses of the line segment, 340 and 350.

The relationship between branch currents and terminal bus voltages of a branch between a bus p and a bus s can be described as follows:

$$\begin{bmatrix} I_{ps} \\ I_{sp} \end{bmatrix} = \begin{bmatrix} Y_{pp} & Y_{ps} \\ Y_{sp} & Y_{ss} \end{bmatrix} \begin{bmatrix} V_p \\ V_s \end{bmatrix}, \quad (1)$$

wherein $I_{ps}$ and $I_{sp}$ are 3-by-1 vectors that represent the phase currents flowing through bus p and bus s into the branch between bus p and bus s, respectively. The vectors $V_p$ and $V_s$ are 3-by-1 vectors that represent the phase-to-ground voltages at bus p and bus s. The matrices $Y_{pp}$ and $Y_{ss}$ are 3-by-3 matrices that represents the self admittance matrix elements at bus p and bus s, and $Y_{ps}$ and $Y_{sp}$ are 3-by-3 matrices that represents the mutual admittance matrices between bus p and bus s, and bus s and bus p, respectively.

Eq. (1) can be used to model a three-phase line segments, or a three-phase transformer. For a three-phase transformer, $I_{ps}$ and $I_{sp}$ are the vectors of phase currents flowing into the primary and secondary sides, $V_p$ and $V_s$ are the vectors of phase-to-ground voltages at the buses of primary and secondary sides. The matrices $Y_{pp}$ and $Y_{ss}$ are the self-admittance matrices of primary side and secondary side, $Y_{ps}$ and $Y_{sp}$ are the mutual admittances between the primary and secondary sides. The admittances can be determined based on the transformer impedances and its tap positions.

For a line segment between bus p and bus s, the self-admittance and mutual matrices can be determined according to:

$$a. \quad Y_{pp} = Y_{ss} = Y_{ps}^{se} + \frac{Y_{ps}^{sh}}{2}, \quad (2)$$

$$Y_{ps} = Y_{sp} = -Y_{ps}^{se}, \quad (3)$$

where, $Y_{ps}^{se}$ is the line series admittance, and equal to the inverse of the series impedance matrix $Z_{ps}^{se}$. $Y_{ps}^{se} = Z_{ps}^{se-1}$.

In contrast with methods that modeled the fault location within the fault line as independent buses, some embodiments integrate the fault conditions of a line fault into a nodal admittance matrix of the line segment. By using nodal admittance matrix based methods to analyze a line fault, the system under fault keeps the same topology as the system under normal states. Similarly, the nodal admittance matrix of the system constructed based on the topology of normal conditions can be used to determine the nodal admittance matrix of the system under fault conditions. For example, one embodiment only modifies the elements of the nodal admittance matrix associated with the terminal buses of the faulty line.

In addition, the system under a fault can be solved with less effort and without factorization of the system admittance matrix if the factorized triangular matrices of the system constructed based on the topology of normal states are available by using numerical methods, such as matrix inversion lemma. This allows avoiding the changes in the dimension of nodal admittance matrix of the system, and complexity of constructing and factorizing the nodal admittance matrix of the system under a fault, which varies in dependence of the type of the fault to be analyzed.

The merging of fault conditions into nodal admittance of fault line is used for both a bolted fault and an impedance fault.

Figure 4:
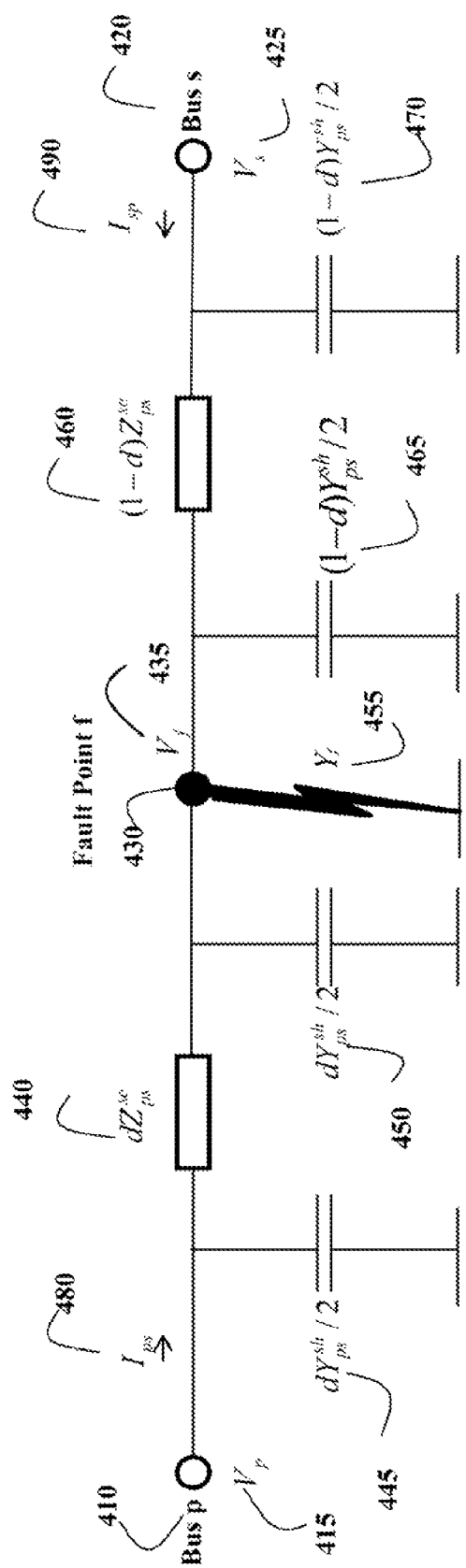
FIG. 4 is a schematic of line segment with a short circuit fault.

FIG. 4 shows an example of a line segment 400 between bus p 410 and bus s 420 with a short-circuit fault at the location f 430. The line segment 400 includes two sub-segments. The first sub-segment is between the bus p 410 and a point of fault f 430, and the second sub-segment is between the fault point f 430 and the bus s 420. The first sub-segment is modeled with series impedance $dZ_{ps}^{se}$, 440 and shunt admittance $dY_{ps}^{sh}$ split into two terminal buses, 445 and 450, and d is the ratio of distance between the fault location f and bus p over length of the line segment. The second sub-segment is modeled with series impedance $(1-d)Z_{ps}^{se}$, 460 and a shunt admittance $(1-d)Y_{ps}^{sh}$ split into two terminal buses, 465 and 470. The impedances of the fault point f 430 are modeled through a 3-by-3 shunt admittance matrix $Y_f$ 455 at the fault point. For a bolted fault, $Y_f$ is a zero matrix, and all elements of the matrix equals to zero. For an impedance fault, some elements of the matrix $Y_f$ are not zero, and determined by the impedances between the faulted phase to the ground, or between faulted phases.

For an impedance fault, the shunt admittance for the fault $Y_f$ can be determined according to:

$$Y_f = \begin{bmatrix} y_{f,a} + y_{f,ab} + y_{f,ca} & -y_{f,ab} & -y_{f,ca} \\ -y_{f,ab} & y_{f,b} + y_{f,ab} + y_{f,bc} & -y_{f,bc} \\ -y_{f,ca} & -y_{f,bc} & y_{f,c} + y_{f,bc} + y_{f,ca} \end{bmatrix}, \quad (4)$$

wherein, $y_{f,a}$, $y_{f,b}$ and $y_{f,c}$ are the admittance of fault path between the phase a, b and c of fault point and the ground respectively, $y_{f,ab}$, $y_{f,bc}$ and $y_{f,ca}$ are the admittance of fault path between two of faulted phases, a and b, b and c, c and a. The admittances introduced by the fault are determined as the inverse of corresponding fault impedances of fault paths. For example, $y_{f,a}$ is determined as the inverse of fault impedance between phase a and the ground, $y_{f,ab}$ is the inverse of fault impedance between phase a and phase b. The default values of those admittances are zero, but then set to non-zero according to the fault conditions. Some of the admittances between the fault phases and the ground are not zero, if the fault is a single-phase-to-ground, a two-phase-to-ground, or a three-phase-to-ground fault. For example, $y_{f,a}$ does equal to zero, if a short circuit fault occurs between phase a to the ground. Similarly, some of the admittances between phases are not zero, if the fault is a phase-to-phase fault, or a phase-to-phase-to-phase fault. For example, $y_{f,ab}$ does not equal to zero, if the short circuit fault occurs between phase a and phase b.

The impacts of a short-circuit fault can be modeled through modifying nodal admittance matrix of the fault line segment accordingly. The self-admittance and mutual admittance matrices of the line segment with a short-circuit fault are defined as:

$$Y_{pp} = \frac{Y_{ps}^{se}}{d} + \frac{dY_{ps}^{sh}}{2} - \frac{Y_{ps}^{se} T^T}{d}\left(\frac{TY_{ps}^{se}T^T}{d(1-d)} + \frac{TY_{ps}^{sh}T^T}{2} + Y_f\right)^{-1} \frac{TY_{ps}^{se}}{d} \quad (5)$$

$$Y_{ss} = \frac{Y_{ps}^{se}}{1-d} + \frac{(1-d)Y_{ps}^{sh}}{2} - \frac{Y_{ps}^{se}T^T}{1-d}\left(\frac{TY_{ps}^{se}T^T}{d(1-d)} + \frac{TY_{ps}^{sh}T^T}{2} + Y_f\right)^{-1} \frac{TY_{ps}^{se}}{1-d} \quad (6)$$

$$Y_{ps} = Y_{sp} = -\frac{Y_{ps}^{se}T^T}{d}\left(\frac{TY_{ps}^{se}T^T}{d(1-d)} + \frac{TY_{ps}^{sh}T^T}{2} + Y_f\right)^{-1} \frac{TY_{ps}^{se}}{1-d} \quad (7)$$

wherein T is a transformation matrix modeling the fault impacts and defined based on the type of the fault.

For example, for an impedance fault, the transformation matrix T is a 3 by 3 matrix, as defined as follows:

$$T = \begin{bmatrix} 1 & 0 & 0 \\ 0 & 1 & 0 \\ 0 & 0 & 1 \end{bmatrix} \quad (8)$$

For a bolted single phase to ground fault, the transformation matrix T is a 2 by 3 matrix determined as:

$$T = \begin{bmatrix} 0 & 1 & 0 \\ 0 & 0 & 1 \end{bmatrix} \quad (9)$$

$$T = \begin{bmatrix} 1 & 0 & 0 \\ 0 & 0 & 1 \end{bmatrix} \quad (10)$$

$$T = \begin{bmatrix} 1 & 0 & 0 \\ 0 & 1 & 0 \end{bmatrix} \quad (11)$$

The equations, (9), (10) and (11) are used for a phase a to the ground fault, a phase b to the ground fault, and a phase c to the ground fault, respectively.

For a bolted phase to phase fault, the transformation matrix T is also a 2 by 3 matrix, and defined as:

$$T = \begin{bmatrix} 1 & 1 & 0 \\ 0 & 0 & 1 \end{bmatrix} \quad (12)$$

$$T = \begin{bmatrix} 1 & 0 & 0 \\ 0 & 1 & 1 \end{bmatrix} \quad (13)$$

$$T = \begin{bmatrix} 1 & 0 & 1 \\ 0 & 1 & 0 \end{bmatrix} \quad (14)$$

The equations, (12), (13) and (14) are used for a phase a to phase b fault, a phase b to phase c fault, and a phase c to phase a fault, respectively.

For a bolted double phase to ground fault, the transformation matrix T is a 1 by 3 matrix. Eq. (15), (16) and (17) are used for a phase a and phase b to the ground fault, a phase b and phase c to the ground fault, and a phase c and phase a to the ground fault, respectively:

T=[0 0 1]  (15)

T=[1 0 0]  (16)

T=[0 1 0]  (17)

For a bolted phase to phase to phase fault, the transformation matrix. T is also a 1 by 3 matrix, as defined as follows:

T=[1 1 1].  (18)

For a bolted three phase to ground fault, the transformation matrix T is a 3-by-3 zero matrix:

T=0,  (19)

and accordingly the self-admittances, and mutual-matrices are defined as:

$$Y_{pp} = \frac{Y_{ps}^{se}}{d} + \frac{dY_{ps}^{sh}}{2}, \quad (20)$$

$$Y_{ss} = \frac{Y_{ps}^{se}}{1-d} + \frac{(1-d)Y_{ps}^{sh}}{2}, \quad (21)$$

$$Y_{ps} = Y_{sp} = 0. \quad (22)$$

Modeling of Zero-Impedance Branches with Floating Neutral Voltages

Many branches in a power distribution system can be regarded as zero-impedance branches, such as step voltage regulators, ideal transformers, switches, jumpers and very short lines. Some methods assign arbitrarily small non-zero impedances to those branches. However, assigning small impedances makes the analysis based on the admittance matrices ill-conditioned, and difficult to converge.

Thus, some embodiments merge those zero-impedance branches with adjacent impedance branches into new non-zero impedance branches to be modeled. The common bus between the zero-impedance branch and adjacent impedance branches to be merged, i.e. the slave bus, is removed. For a jumper, switch or short line branch, it can be merged with branches connected to either one of its terminal buses. However, for an ungrounded-connected transformer or voltage regulator branch, the branches to be merged must be the branches connected to the terminal bus that its floating neutral voltage can be regarded as zero, such that the impacts of floating neutral voltage of terminal buses of ungrounded transformer or regulator can be accurately modeled.

Figure 5:
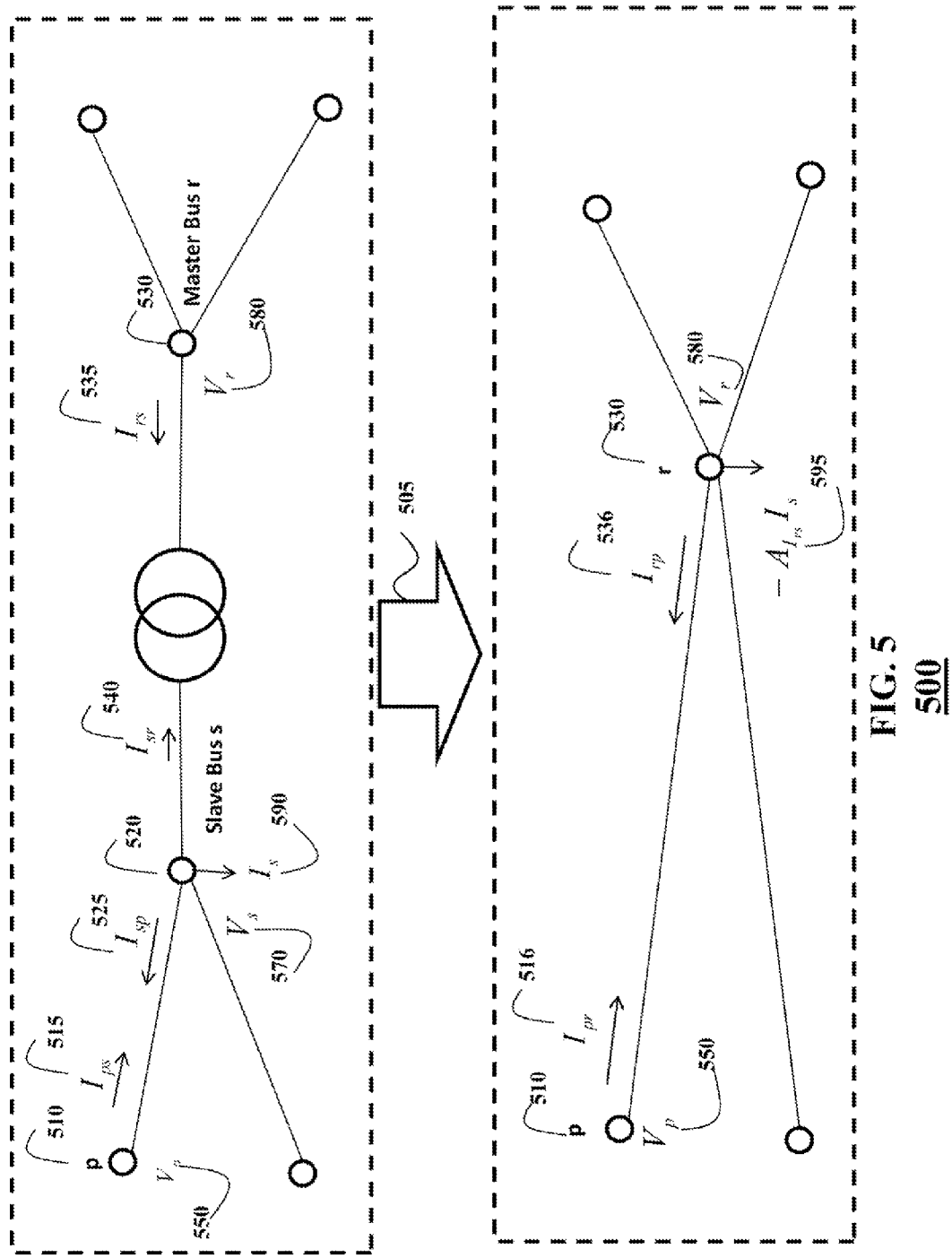
FIG. 5 is a schematic of modeling zero-impedance branches.

FIG. 5 shows an example of a generalized three-phase zero-impedance branch between bus s 520 and bus r 530. One of the buses, bus r 530, is assigned to be a master bus, and the other bus, bus s 520 is assigned to be a slave bus. The buses are connected by an ideal transformer. The slave bus 520 is connected with a load current $I_s$ 590. The phase-to-ground voltages of the two terminal buses, and two directional phase currents on the branch are related to each other with the voltage amplifying factor matrices, $A_{V_{sr}}$ and $A_{V_{rs}}$, and current amplifying factor matrices, $A_{I_{sr}}$ and $A_{I_{rs}}$ as:

$$V_s = A_{V_{sr}} V_r, \quad (23)$$

$$V_r = A_{V_{rs}} V_s, \quad (24)$$

$$I_{sr} = A_{I_{sr}} I_{rs}, \quad (25)$$

$$I_{rs} = A_{I_{rs}} I_{sr}, \quad (26)$$

wherein $V_s$ 570 and $V_r$ 580 are the vector of phase-to-ground voltages of bus s 520 and bus r 530, $I_{sr}$ 540 and $I_{rs}$ 535 are the vector of phase currents flowing from bus s 520 to bus r 530, and bus r 530 to bus s 520 respectively. These amplifying factor matrices can be determined according to the winding connection and tap positions for a transformer or a voltage regulator, and the phase connection for a switch, a short line or a jumper.

As shown in FIG. 5, the zero-impedance branch is merged 505 into adjacent impedance branches, such that the slave bus is not considered in the analysis of the model. In the example, the zero-impedance branch is connected to two branches by the slave bus s 520, and to another two branches by the master bus r 530. In the equivalent model, the zero-impedance branch and the slave bus s 520 are removed. There are no changes for the branches connected to the master bus r 530. The branches connected to the slave bus s 520 are reconnected to bus r 530, and the nodal admittance matrices of the branch and the current injections at the master bus r 530 are modified accordingly. The load current $I_s$ 590 at bus s 520 is modeled as an equivalent current at bus r 530, as $-A_{I_{rs}}I_s$ 595. The branch between bus p 510 and bus s 520 is replaced with a new branch directly between bus p 510 and bus r 530, and the branch currents, $I_{pr}$ 516 and $I_{rp}$ 536, and the nodal voltages, $V_p$ 550 and $V_r$ 580, are related as:

$$\begin{bmatrix} I_{pr} \\ I_{rp} \end{bmatrix} = \begin{bmatrix} Y_{pp} & Y_{ps}A_{V_{sr}} \\ -A_{I_{rs}}Y_{sp} & -A_{I_{rs}}Y_{ss}A_{V_{sr}} \end{bmatrix} \begin{bmatrix} V_p \\ V_r \end{bmatrix}, \qquad (27)$$

If the amplifying matrices are expressed with phase-to-phase voltages, (27) is replaced by the following equation:

$$\begin{bmatrix} I_{pr} \\ I_{rp} \end{bmatrix} = \begin{bmatrix} Y_{pp} & Y_{ps}C_V^{GP}A_{V_{sr}}^{PP}C_V^{PG} \\ -A_{I_{rs}}Y_{sp} & -A_{I_{rs}}Y_{ss}C_V^{GP}A_{V_{sr}}^{PP}C_V^{PG} \end{bmatrix} \begin{bmatrix} V_p \\ V_r \end{bmatrix}, \qquad (28)$$

where, $A_{V_{sr}}^{PP}$ and $A_{V_{rs}}^{PP}$ are the voltage amplifying factor matrices for the branch between bus s 520 to bus r 530 written in terms of phase-to-phase voltages, and phase-to-phase voltages at bus s 520, and bus r 530, $V_s^{PP}$ and $V_r^{PP}$ are related as:

$$V_s^{PP} = A_{V_{sr}}^{PP} V_r^{PP}, \qquad (29)$$

$$V_r^{PP} = A_{V_{rs}}^{PP} V_s^{PP}, \qquad (30)$$

where, $C_V^{PG}$ is a conversion factor matrix to be used to convert voltages from phase-to-ground form into phase-to-phase one. Thus, for the bus r $$V_r^{PP} = C_V^{PG} V_r \qquad (31)$$

The matrix $C_V^{GP}$ is defined as:

$$C_V^{GP} = \begin{bmatrix} 1 & -1 & 0 \\ 0 & 1 & -1 \\ -1 & 0 & 1 \end{bmatrix}, \qquad (32)$$

wherein $C_V^{GP}$ is a conversion factor matrix to be used to convert voltages in the form of phase-to-phase into phase-to-ground, and defined as:

$$C_V^{GP} = \begin{bmatrix} 1/3 & 0 & 1/3 \\ -1/3 & 1/3 & 0 \\ 0 & -1/3 & 1/3 \end{bmatrix}, \qquad (33)$$

For a bus s, its phase-to-ground voltages can be determined from its phase-to-phase voltages according to:

$$V_s = C_V^{GP} V_s^{PP} + [1\ 1\ 1]^T v_{s,neutral}, \qquad (34)$$

where, $v_{s,neutral}$ is the voltage of floating neutral, or fictitious neutral of bus s, and calculated as:

$$v_{s,neutral} = [1/3\ 1/3\ 1/3] \qquad (35)$$

If the amplifying matrices are expressed with phase-to-phase voltages, then Eq. (28) is used only when the neutral voltage of slave bus s can be regarded as zero. Therefore, for a DELTA-connected or WYE-connected transformer or regulator, only the terminal bus with a neutral voltage at zero is selected as a slave bus. During a fault, the bus that is close to the fault is selected as a master bus, and the remaining bus is selected as a slave bus.

Taken FIG. 5 as example, for the zero-impedance branch between the bus s 520 and the bus r 530, assumed that bus s 520 is closer to an equivalent generation source, and the bus r 530 is closer to the location of fault, so bus s 520 is selected as the slave bus. The bus s 520 is located at the side close to the equivalent generation source, and its neutral voltage can be regarded as zero. For the bus r 530, if there is a fault at a line segment downstream to the bus r, its neutral voltage is determined by the downstream fault conditions. For example, if a single-phase-to-ground occurs at a location close to bus r 530, the magnitude of neutral voltage of bus r 530 may increase to a value close to 1.0 per unit.

Modeling of Generation Sources

The power supply for the distribution system can come from two sources. One is the equivalent generation source that represents the transmission systems fed the distribution system. The other is the distributed generation sources that represent the generators dispersed within the distribution system. Loads with large motors can also be considered as distributed generation sources with negative power during a severe fault condition. When a fault occurs with the system, a generation source can be modeled as a constant voltage source behind an equivalent three-phase impedance branch as shown in FIG. 6.

Figure 6:
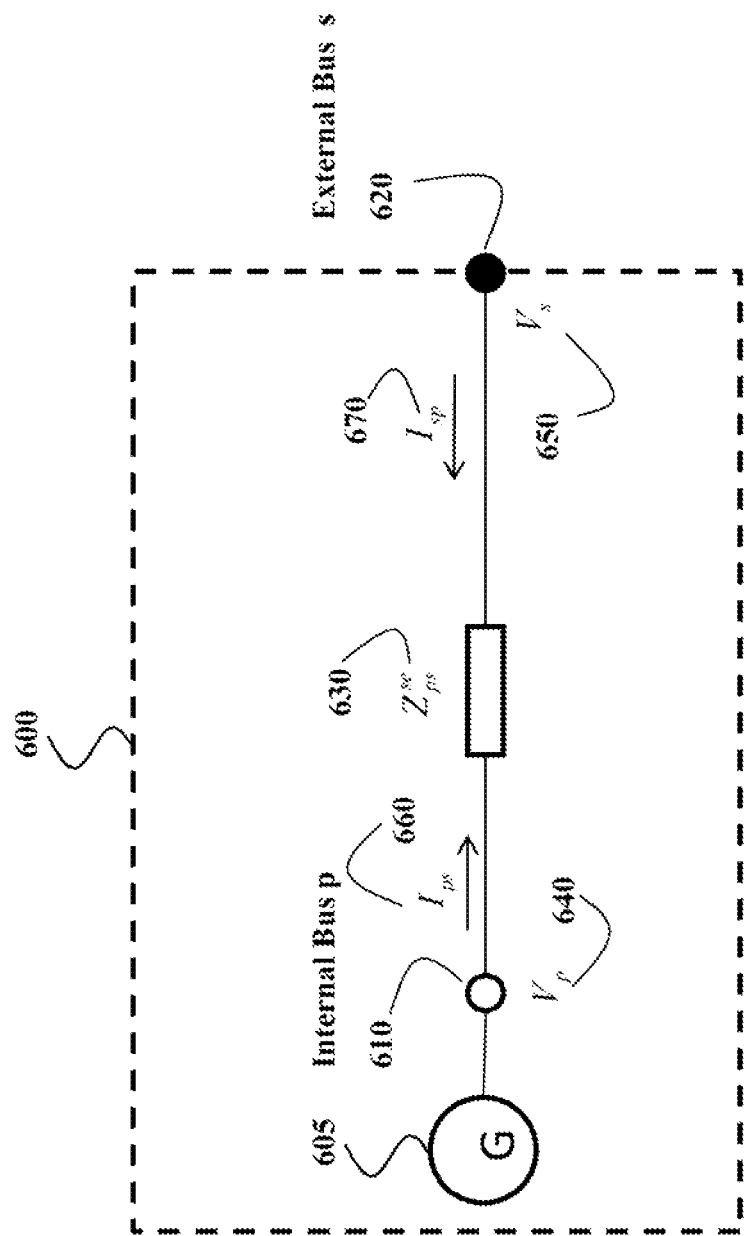
FIG. 6 is a schematic of modeling generation sources.

FIG. 6 shows an example of generation source 600 with an impedance branch between its internal bus p 610 and its external bus s 620. The impedance branch is represented by a 3-by-3 series impedance matrix $Z_{ps}^{se}$ 630.

During the fault analysis, the internal bus p is modeled as a swing bus for an equivalent generation source, and a constant active power and voltage magnitude (PV) bus for a distributed generation source. The external bus s is modeled as a constant active power and reactive power (PQ) bus.

The scheduled voltages and powers of internal buses can be determined by a pre-fault load flow analysis. During the load flow analysis, the external buses are modeled as either a swing bus, or a PV bus, and the internal buses are not included.

Using nodal admittance matrix based methods, for an equivalent generation source, each phase of the internal bus and the external bus can be treated as an independent node. For a distributed generation source, the external bus can be treated as three nodes as well, but as to the internal bus, the bus model is dependent on the regulation pattern of the generator. If three-phases of generator regulated independently, then the internal bus is modeled as three nodes. If three-phases regulated jointly, the three-phases of the internal bus are combined as a single phase bus to be modeled to avoid the coordination between three phases.

The impedance branch of the generation source can be modeled by a 6-by-6 nodal admittance matrix by using Eq, (1), when both internal and external buses are modeled as three phase buses. The self and mutual matrices are determined according to:

$$Y_{pp} = Y_{ss} = Z_{ps}^{se^{-1}}, \qquad (36)$$

$$Y_{ps} = Y_{sp} = -Z_{ps}^{se^{-1}}. \qquad (37)$$

The jointly-regulated generation source can be modeled as a 4-by-4 nodal admittance matrix described in Eq. (38). The joint-regulation of a generator maintains the three phase voltage balanced and the magnitude of voltages and total active power of three-phases as constant.

Taken the generator 605 in FIG. 6 as example, if bus p 610 is an internal bus of a jointly regulated generator, the three phases are combined into one equivalent phase, and the generator branch between bus p 610 and bus s 620 can be described as follows:

$$\begin{bmatrix} I_{ps,e} \\ I_{sp} \end{bmatrix} = \begin{bmatrix} R^T Z_{ps}^{se-1} R^* & -R^T Z_{ps}^{se-1} \\ -Z_{ps}^{se-1} R^* & Z_{ps}^{se-1} \end{bmatrix} \begin{bmatrix} V_{p,e} \\ V_s \end{bmatrix}, \quad (38)$$

where $I_{ps,e}$ is the equivalent phase current flowing on the branch from bus p to bus s, $V_{p,e}$ is the phase-to-ground voltage at an equivalent phase c of the bus p, R is a rotation vector to rotate all phases to the selected equivalence phase e, $R^T$ and $R^*$ are the transpose and conjugate of rotation vector R respectively.

It phase a is chosen as the equivalent phase, then:

$$V_{p,e} = V_{p,a}, \quad (39)$$

$$I_{ps,e} = R^T I_{ps}, \quad (40)$$

$$R = [1 \ e^{j120°} \ e^{-j120°}]^T. \quad (41)$$

where $V_{p,a}$ is the phase-to-ground voltage at phase a of bus p.

Initializing of Bus Voltages

Some embodiments reduce the required iterations for line fault analysis, by initializing the voltages of the buses based on the control zone that the bus of interest is located. The control zones include equivalent generation source controlled zone, distributed generation source zones, and fault controlled zone.

Figure 7:
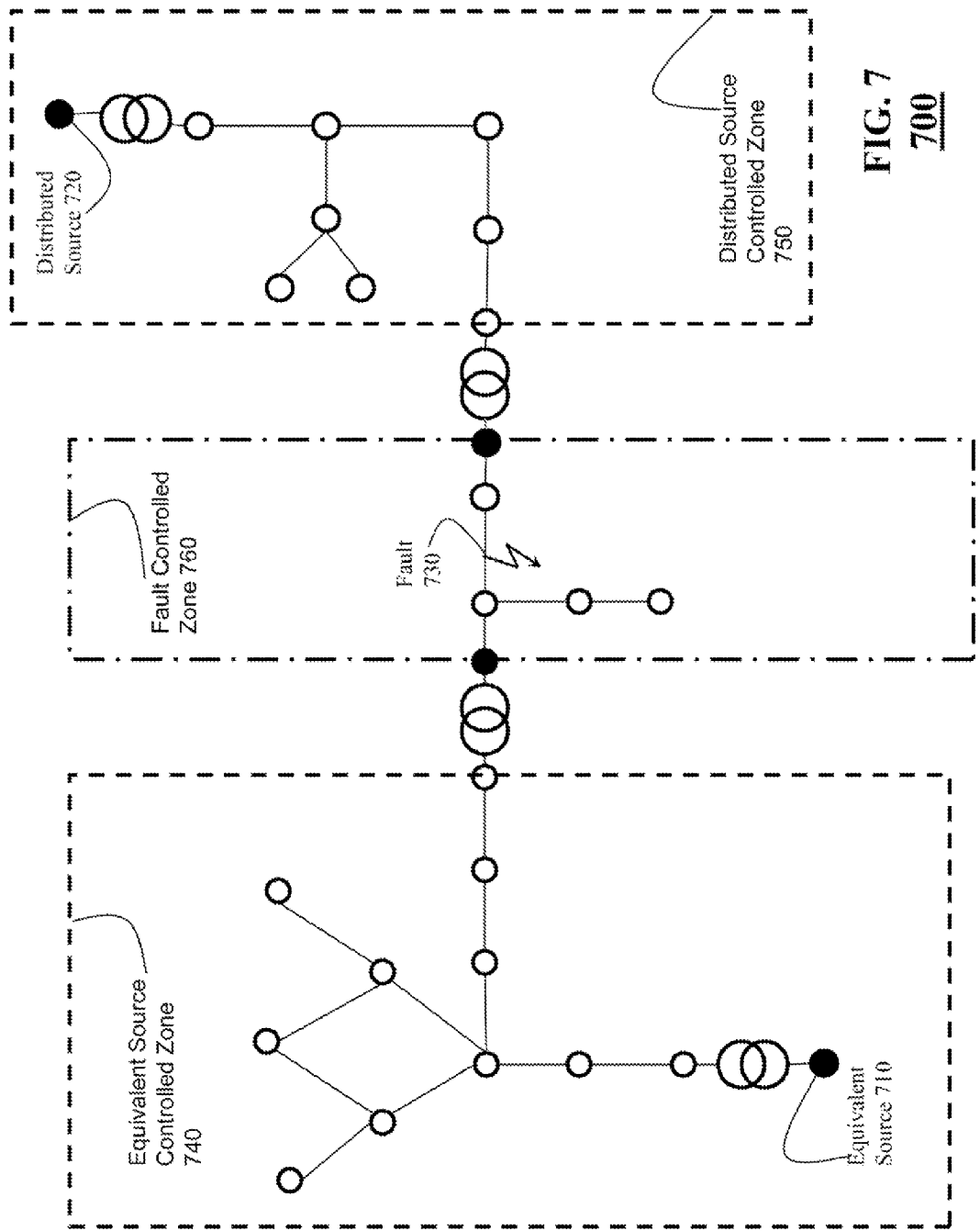
FIG. 7 is a schematic of determining generation source controlled zones and fault controlled zone.

FIG. 7 shows an example of distribution system 700 with a fault 730. The system 700 includes one equivalent generation source 710, and one distributed generation source 720. The three control zones for the system can be determined based on the locations of fault and generation sources, including equivalent generation source controlled zone 740, distributed generation source controlled zone 750, and fault controlled zone 760.

The fault controlled zone 760 includes all buses that have connected with the terminal buses of the faulty line without passing through any ungrounded transformers or voltage regulators. The fault controlled zone can be formed by executing an all-connected tracing starting at one of terminal buses of the faulty line and ending at the terminal buses of ungrounded transformers or voltage regulators. The distributed generation source controlled zone for each distributed generation source can be formed by executing the all-connected tracing starting at the external bus of the distributed generation source and ending at the terminal buses of ungrounded transformers or voltage regulators connected to the boundaries of fault controlled zone. The equivalent source controlled zone includes all buses that are not included by the fault and distributed generation source controlled zones in the system.

The voltages of buses within the fault controlled zone can be initialized with the initial voltages at the location of the fault. The initial voltage of the fault point is determined based on the fault type. For a single-phase-to-ground, the initial voltage of faulted phase is zero, and two other functional phases are set as 1.732 per unit. For a double-phase-to-ground or a phase-to-phase fault, the initial voltages of the faulty phases are zero, and the functional phase, i.e., the phases without fault, is set as 1.732 per unit. For a three-phase-to-ground, the initial voltages of all phases are set to be zero.

The initial voltages of the buses within the equivalent or distributed generation source controlled zones are set to the values at the internal bus of the equivalent or distributed generation source multiplied with the aggregated voltage amplifying factor matrix introduced by the transformers or voltage regulators along the shortest path between the external bus of equivalent or distributed generation source and the bus of interest, according to:

$$V_p^{(0)} = \Pi_{sr} A_{V_{sr}} V_{src}, \quad (42)$$

where, $V_p^{(0)}$ is the vector of initial voltages of bus p, $V_{src}$ is the voltage of the internal bus of equivalent or distributed generation source, $A_{V_{sr}}$ is the voltage amplifying factor matrix of a voltage regulator or transformer between two buses, bus s and bus r residing on the shortest path from the source external bus to the bus under consideration.

Partitioning the System into Main Network and Lateral Networks

Some embodiments increase efficiency by partitioning the distribution system into a main network and a set of lateral network through topology analysis. The main and lateral networks are analyzed recursively by, e.g., nodal admittance matrix based Gauss-Seidel method, and topology based backward/forward sweep respectively. The method takes advantage of the strong capability provided by the matrix based methods for handling fault conditions and multiple generation sources, and the computation efficiency provided by topology based method for radial systems.

The steady-state behaviors of a system with a fault are mainly dependent on the location and type of the fault, and the generation sources. The main network is used to represent the impacts of those devices and factors on system operation.

Figure 8:
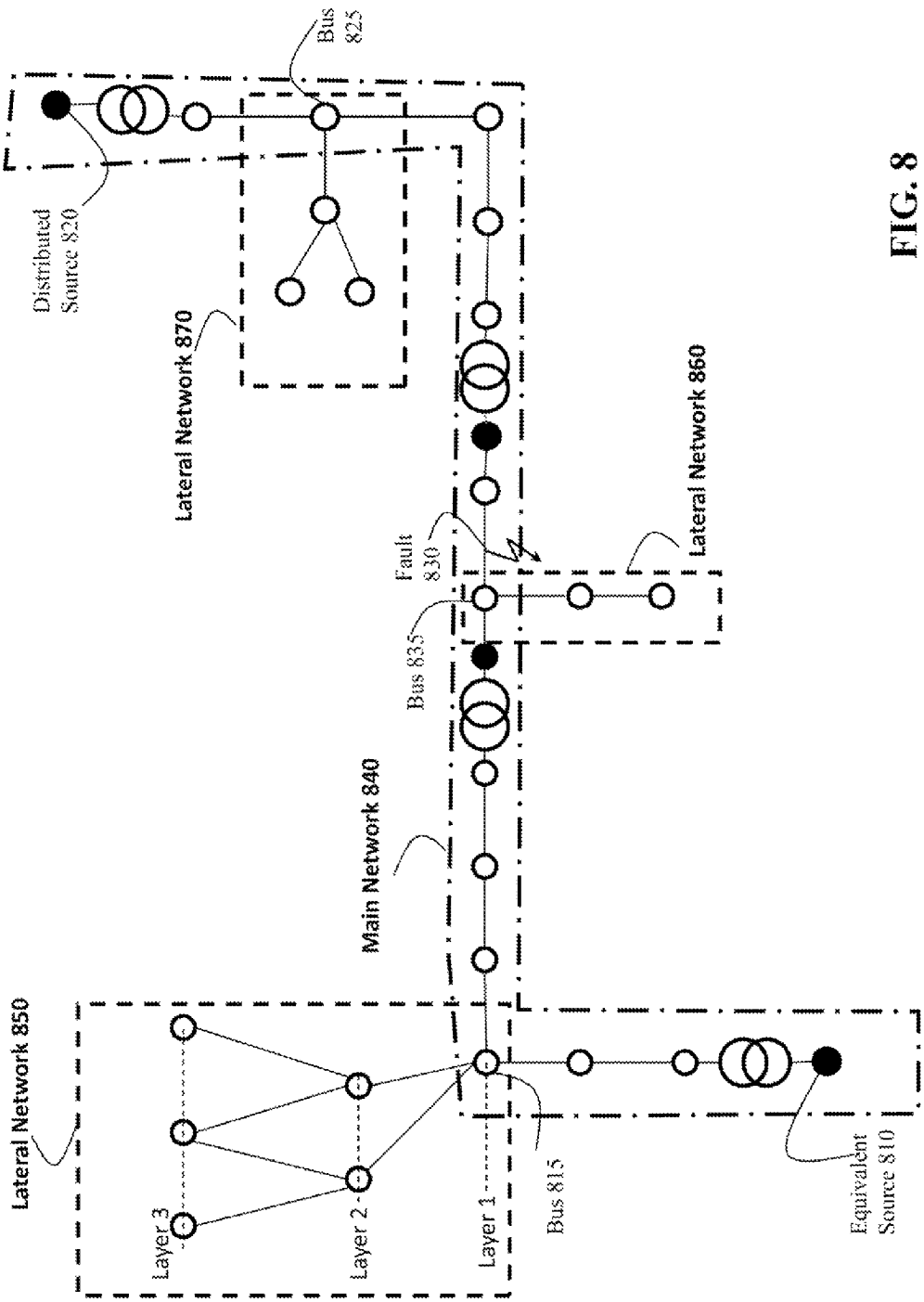
FIG. 8 is a schematic of determining main network and lateral networks.

FIG. 8 shows an example of distribution system 800 with a line fault 830. The system includes one equivalent generation source 810, and one distributed generation source 820. Based on the location of fault, and generation sources, the system is partitioned into a main network 840, and three lateral networks, 850, 860 and 870. The main network 840 is formed by buses and devices residing on the shortest paths between the buses of faulted line 830, the equivalent generation source 810, and distributed generation sources 820. A lateral network is formed by one of buses of main network as its root bus, and all buses and devices downstream and fed by the bus.

For example, the lateral network 850 starts from a bus 815 of the main network, and includes all buses and devices downstream to the bus 815. As can be seen, the lateral network 850 forms a loop. The lateral network 860 starts from a bus 835 of the main network, and includes all buses and devices downstream to the bus 835. The lateral network 870 starts from a bus 825 of the main network, and includes all buses and devices downstream to the bus 825. The lateral networks 860 and 870 have no loops and are a radial system.

Based on the number of devices connected between a bus and the root bus of a lateral network, the lateral networks can be divided into layers. For example, in FIG. 8, the lateral network 850 is divided into three layers, where the first layer includes one bus, and the last third layer includes three buses. The layers of the lateral network can be used in the forward/backward sweep analysis.

Modeling of Lateral Loops

Figure 9:
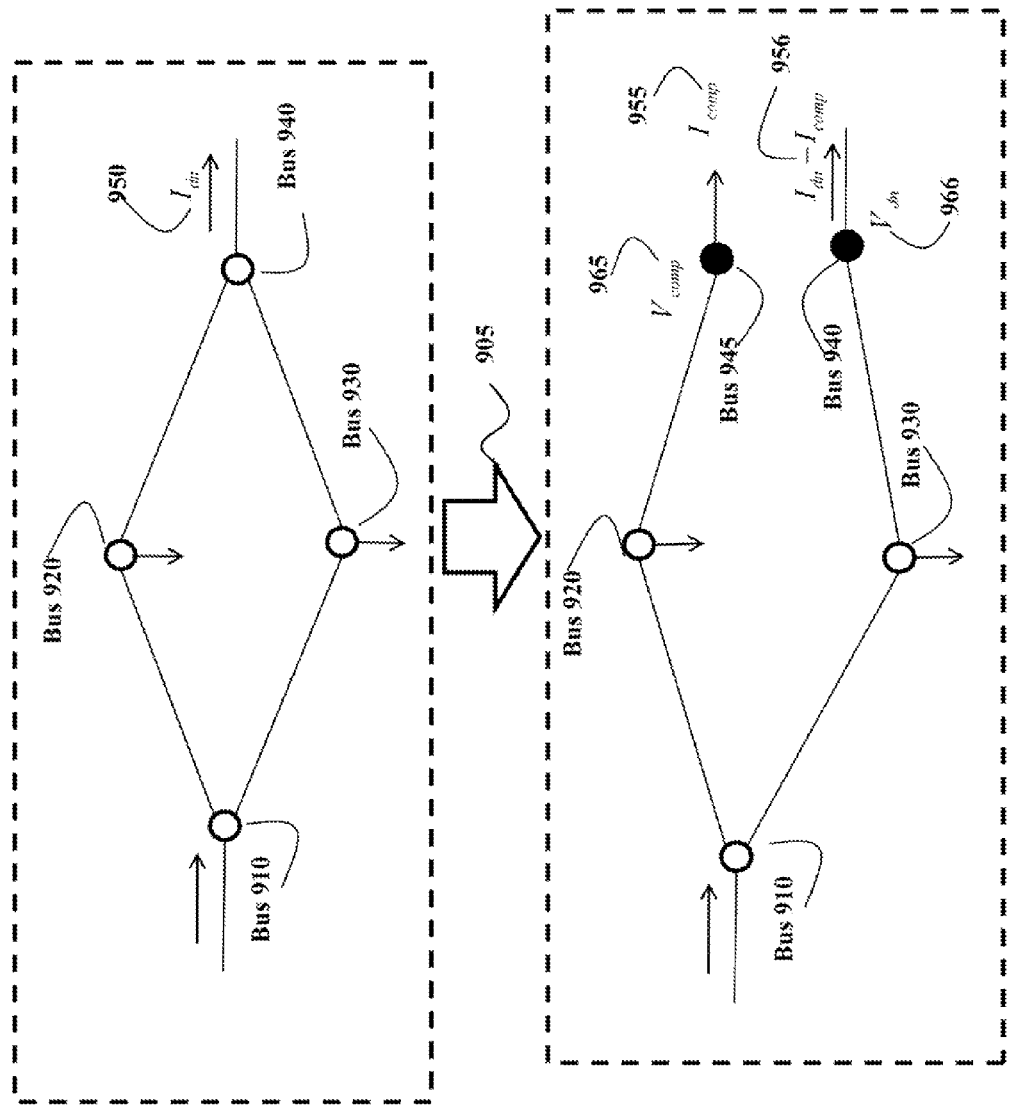
FIG. 9 is a schematic of breaking a loop into radial paths.

In some embodiments, the loops in a lateral network are partitioned into radial paths to be considered, and the downstream load current fed by the loop is allocated between two breakpoints, in order to maintain their voltages identical. FIG. 9 shows an example of a construction of an equivalent model for a lateral network having a loop formed between an upstream bus 910 and a downstream intersection bus 940. There are two paths available from bus 910 to bus 940. One path is through bus 920, and the other one is through bus 930. Let $I_{dn}$ 950 be the load current at bus 940.

The method models 905 the loop by replacing the downstream intersection bus 940 with two breakpoints, i.e., one is the original bus 940, and the other is a new compensation bus 945. Compensation current $I_{comp}$ 955 is added as a load to the compensation bus 945, and as a negative load to the original bus 940. The load current of the bus 940 can be set as the original load current. $I_{dn}$ minus the compensation current $I_{comp}$.

The vector of compensation current $I_{comp}$ is determined according to $$I_{comp} = A_{comp} I_{dn}, \qquad (43)$$

where, $A_{comp}$ is the allocation factor matrix to be used to allocate downstream currents between two parallel loop paths. The allocation factor matrix can be determined based on the series impedance matrices of two paths according to $$A_{comp} = Z_{up-dn}(Z_{up-dn} + Z_{up-comp})^{-1}, \qquad (44)$$

where, $Z_{up-dn}$ is the impedance matrices for the path from the upstream bus 910 to the downstream bus 940, and $Z_{up-comp}$ is the impedance matrices for the path from the upstream bus 910 to the compensation bus 945. When constructing the path impedance matrices, the shunt admittance of a line section is ignored, a transformer or a voltage regulator is treated as zero impedance, and only the series impedances are used. The path impedance matrices are 3-by-3 matrices if the devices along the paths are all three-phase.

Using the above equation, the loads at a downstream bus is initially allocated to two parallel paths. The currents along the two paths have to be adjusted, if the voltages at the two breakpoints are different. The incremental compensation current, $\Delta I_{comp}$ is determined according to $$\Delta I_{comp} = Z_{comp}^{-1} \Delta V_{comp}, \qquad (45)$$

where, $\Delta V_{comp}$ is the vector of the voltage difference between the compensation bus and the loop downstream intersection bus:

$$\Delta V_{comp} = V_{comp} - V_{dn}, \qquad (46)$$

where $V_{comp}$ 965 and $V_{dn}$ 966 are the phase-to-ground voltages at the compensation bus 945, and the original bus 940, respectively, $Z_{comp}$ is a loop impedance matrix, which for an independent loop can be determined as the sum of two path impedance matrices according to $$Z_{comp} = Z_{up-dn} + Z_{up-comp}, \qquad (47)$$

If some of the loops share common paths between different loops, then Equation (45) still can be applied. In this case, the vector $\Delta I_{comp}$ and $\Delta V_{comp}$ includes the corresponding compensation current and voltage changes for each loop. The loop impedance matrices $Z_{comp}$ are formed based on the path impedance matrix for each loop, and common path impedance between loops. The diagonal sub matrix is equal to the sum of the branch impedance for all branches in the loop, and the off-diagonal sub matrix is non-zero only if two loops share one or more common branches. The signs of the off-diagonal sub matrices depend on the relative direction of the compensation currents for the two loops.

Solving Main Network

The main network is formed by buses on the paths between the buses of the faulty line, and generation sources. The main network may be radial, or meshed. The modeled buses and phases in the main network are converted to nodes to construct the mathematical equations for short circuit analysis. The number of nodes for each bus is equal to the number of modeled or available phases at the bus.

The nodal current injection equations in polar coordinates are used to express the relationship between the voltages of buses and the currents of branches for a distribution system with a line fault. The impacts of line fault, zero-impedance branches, and three-phase joint-regulation requirements of distributed generation sources are embedded into the nodal admittance matrix o-f the main network.

The voltage and current distribution of the main network can be solved using the nodal current injection equations:

$$I = YV, \qquad (48)$$

where I is the vector of equivalent complex current injections, V is the vector of complex voltages for all nodes, and Y is the complex nodal admittance matrix. In some embodiments, the nodal admittance matrix Y is constructed based on the nodal admittance model for each impedance branch in the system. The constant impedance load and shunt compensation at the bus are treated as self-admittances, to be included in the nodal admittance matrix.

Due to the dependency of nodal current injections on nodal voltages, the solution of Equation (48) is obtained by iteratively solving the following nodal current injection mismatch equations:

$$\Delta I = Y \Delta V, \qquad (49)$$

Equation (49) includes the nodes for the PQ and PV buses. The nodes associated with the swing bus are not included, because their complex voltages are known. At each iteration, a current injection mismatch for each node $\Delta I$ is determined based on the properties of connected loads and generation sources and the most recently computed nodal voltages. Then, an incremental voltage change $\Delta V$ is computed using the factorized nodal admittance matrix.

The equivalent current injections for each bus are determined by the connected generation sources and loads, if the bus is not a root bus of lateral networks. For the root bus of a lateral network, the equivalent current injections at the bus are determined by the connected loads and downstream branches. For example, the equivalent current injection $I_{p,x}$ for the bus p on the phase x is determined according to $$I_{p,x} = I_{p,x}^{eqv} + \Sigma_{s \in DD_p} I_{ps,x}, x \in \{a,b,c\}, \qquad (50)$$

wherein $I_{p,x}^{eqv}$ is the equivalent phase current of bus p at phase x, $I_{ps,x}$ is the equivalent phase current flowing through bus p toward bus s at phase x, and $DD_p$ is the set of buses that connect with bus p and reside in the lateral network fed by the bus p.

A new Eq. (48) can be formulated when a new fault needs to be analyzed. However, if a solution has already obtained for a specific fault, and a new fault to be analyzed is on the same line segment but at the different location, or different fault type, then there is no need to factorize the new formulated admittance. The solution for the new fault can be obtained based on available factorized admittance matrices, and admittance changes between the previous fault and the new fault.

For example, a solution has already obtained for $I = YV$, and a solution is wanted for $I = \hat{Y} V$, where the difference between $Y$ and $\hat{Y}$ is a low rank change, that is only a 6-by-6 block corresponding to the terminal buses of fault line segment need to be modified:

$$\hat{Y} = (Y + M \Delta Y M^T), \qquad (51)$$

where, $\Delta Y$ is a 6-by-6 matrix describing the nodal admittance change for the terminal buses of the line segment having fault, M is an n-by-6 connection matrix, n is the total number of nodes, and $M_{ij}$ is 1.0 when i is the row corresponding to the node of the element changes for the modification of Y caused by a fault at a line segment, and j is the column corresponding to the phase of the terminal buses of fault line segment.

Based on the matrix inversion lemma, a new solution can be obtained according to:

$$(Y+M\Delta Y M^T)^{-1} = Y^{-1} - Y^{-1}M(\Delta Y^{-1} + M^T Y^{-1} M)^{-1} M^T Y^{-1} \quad (52)$$

The new solution for the main network can be obtained based on existing lower and upper triangular factorization matrices, and a set of forward and backward substitutions.

Solving Lateral Networks

A lateral network is formed by a set of buses downstream and fed by a bus of main network. In some embodiments, a backward/forward sweep with loop breakpoint compensation method is applied. The method includes two integrated steps. The first is the backward sweep step, which calculates the branch currents, starting from the branches at the last layers and moving towards the branches connected to the root bus. The second step is the forward sweep step, which updates the branch terminal voltages, starting from the branches in the first layer towards those in the last. For each branch between an upstream bus and a downstream bus, the voltage at downstream bus is calculated using the updated voltages at the upstream bus.

For a three-phase transformer, the backward/forward sweep steps need to calculate the inverse of admittance matrices, and unfortunately for ungrounded connections, some of those matrices are singular. The phase-to-phase voltages, and phase currents are used to express the transformer model in lateral networks. Because the primary and secondary buses are ungrounded, the sum of the three phase currents are zero, so only two phase currents and only two of the three phase-to-phase voltages are used by some embodiments.

For example, if currents at, phase a and b are chosen as current variables, and phase-to-phase voltage between phase a to phase b, and phase b to phase c as voltage variables, the transformer model can described as follows:

$$\begin{bmatrix} I'_{ps} \\ I'_{sp} \end{bmatrix} = \begin{bmatrix} Y^{PP}_{pp} & Y^{PP}_{ps} \\ Y^{PP}_{sp} & Y^{PP}_{ss} \end{bmatrix} \begin{bmatrix} V^{PP'}_p \\ V^{PP'}_s \end{bmatrix}, \quad (53)$$

wherein $I'_{ps}$ and $I'_{sp}$ are 2-by-1 vectors representing the currents of phase a and phase b at primary and secondary sides, and $V_p^{PP'}$ and $V_s^{PP'}$ are 2-by-1 vectors representing the phase-to-phase voltages between phase a to phase b, and phase b to phase c at the primary and secondary sides.

The admittance matrix is a 4-by-4 matrix, and is divided into four 2-by-2 blocks, including primary and secondary self-admittance matrices, and mutual admittances between primary and secondary sides. If not given, the phase-to-phase voltage based matrices represented in Equation (53) are converted from the phase-to-ground voltage based matrices by multiplying the phase-to-ground based matrices with the voltage conversion factor matrix $C_V^{GP'}$ defined in Equation (55):

$$Y^{PP}_{mn} = Y_{mn} C_V^{GP'}, \quad (54)$$
$$m, n \in \{p, s\}$$

$$C_V^{GP'} = \begin{bmatrix} 2/3 & 1/3 \\ -1/3 & 1/3 \\ -1/3 & -2/3 \end{bmatrix}. \quad (55)$$

The voltage conversion factor matrix $C_V^{GP'}$ can be used to determine the three phase-to-ground voltages, if two phase-to-phase voltages between phase a to phase b, and phase b to phase c are known, and the neutral voltages are very close to zero.

In the backward sweep step of some embodiments, $I'_{sp}$ and $V_s^{PP'}$ are known, while $I'_{ps}$ is determined according to $$I'_{ps} = Y^{PP}_{pp} Y^{PP^{-1}}_{sp}(I'_{sp} - Y^{PP}_{ss} V_s^{PP'}) + Y^{PP}_{ps} V_s^{PP'}. \quad (56)$$

In the forward sweep step of some embodiments, $I'_{sp}$ and $V_p^{PP'}$ are known, while $V_s^{PP'}$ is determined according to $$V_s^{PP'} = Y^{PP^{-1}}_{ss}(I'_{sp} - Y^{PP}_{sp} V_p^{PP'}). \quad (57)$$

In order to simplify the calculations for three-phase lines, in some embodiments, the π-model of the distribution line is replaced with a series impedance branch by merging the line charging of shunt admittances into terminal buses, as shown in FIG. 3, The internal currents, $I'_{ps}$ and $I'_{sp}$ that flow directly through the series impedances are used to replace the actual branch currents, $I_{ps}$ and $I_{sp}$, as the variables of the model to be solved. The actual branch currents can be determined by adding the line-charging currents to the internal currents, after the converged solutions are obtained.

For a backward sweep method, $I_{sp}$ and $V_s$ are known, and $I_{ps}$ is determined according to $$I_{ps,x} = -I_{sp,x}, x \in \{a,b,c\}, \quad (58)$$

wherein $I_{ps,x}$ and $I_{sp,x}$ are the branch currents entering from bus p and bus s on phase x, which can be one of the available phases a, b or c. For a forward sweep method, the branch currents $I_{ps}$ and the bus voltages $V_s$ at the sending bus are known, and the bus voltages at a receiving bus $V_s$ are determined according to $$V_s = V_p - Z_{ps}^{se} I_{ps}. \quad (59)$$

In a backward sweep, for any branch between upstream bus p and downstream bus s, the branch current entering the downstream bus s is determined according to $$I_{sp,x} = -I_{s,x} - \Sigma_{t \in DN_s} I_{st,x}, x \in \{a,b,c\}, \quad (60)$$

where $I_{s,x}$ is the equivalent current for bus s at phase x; $DN_s$ is a set of downstream buses connected to the bus s, and $I_{st,x}$ is the phase current entering from bus s to a branch between bus s and bus t.

The equivalent phase current for a bus takes contributions from the connected loads, the line charging from connected lines. It also includes the contribution from the loop compensation currents, if it is one of loop breakpoints. The loads are DELTA-connected in an ungrounded system. The loads include constant power loads, constant current loads, and constant impedance loads. The equivalent phase currents at bus p can be determined according to $$I_p^{eqv} = C_I^{GP} I_p^{PP} - \sum_s \frac{Y_{ps}^{sh} V_p}{2} + I^{comp}, \quad (61)$$

The first component of the right-hand side of Equation (61) is the contribution from connected loads which are calculated as phase-to-phase currents, $I_p^{PP}$ and then converted to phase currents using the current conversion factor matrix $C_I^{GP}$ defined as:

$$C_I^{GP} = \begin{bmatrix} 1 & 0 & -1 \\ -1 & 1 & 0 \\ 0 & -1 & 1 \end{bmatrix}. \tag{62}$$

The second component of the right-hand side of Equation (61) is the contribution of line charging for all lines that connect to bus p. The third component, $I^{comp}$, is the contribution of loop compensation currents that can be determined using Equation (43) and Equation (45) if bus p is one of loop breakpoints, and is a positive value for the breakpoint corresponding to the compensation bus, and negative value for another breakpoint of the loop that corresponds to the original bus.

The phase-to-phase current at bus p between phase x and y can be determined as:

$$I_{p,xy} = \frac{S_{S_{p,xy}}^{R*} + S_{I_{p,xy}}^{R*}|V_{p,xy}|/|V_{p,xy}^R| + S_{Z_{p,xy}}^{R*}|V_{p,xy}|^2/|V_{p,xy}^R|^2}{V_{p,xy}^*}, \tag{63}$$

$xy \in \{ab, bc, ca\}$ where, $S_{S_{p,xy}}^R$, $S_{I_{p,xy}}^R$ and $S_{Z_{p,xy}}^R$ are the rated powers at bus p and between phase x to phase v of constant power loads, constant current loads and constant impedance loads respectively, and $v_{p,xy}^R$ is the rated voltage at bus p and between phase x to y.

In a forward sweep, the phase-to-phase voltages are used for calculation of transformers and voltage regulators, and then converted into phase-to-ground voltages by using the voltage conversion factors. The phase-to-ground voltages are used for calculation of line segments, and then converted into phase-to-phase voltages if the connected device is a transformer or voltage regulator.

EXAMPLE

Figure 10:
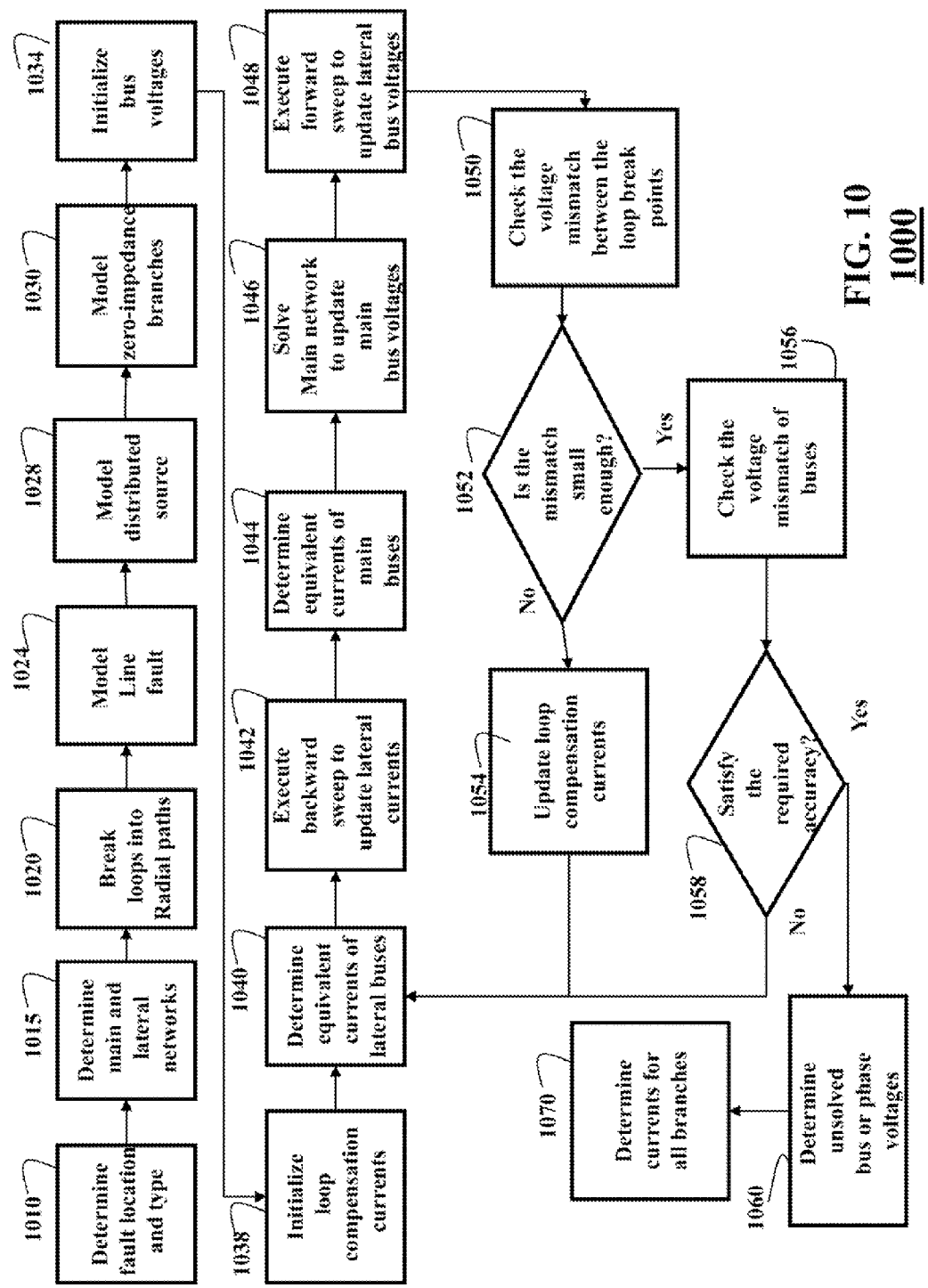
FIG. 10 is a block diagram of a method for analyzing a line fault of an ungrounded distribution system according to some embodiments of the invention.

FIG. 10 shows a block diagram of a method 1000 for line fault analysis of an ungrounded distribution system according to some embodiments of the invention. Various embodiments of invention use at least part of the steps of the method 1000, The step 1010 determines the fault, including the type of fault, the line segment having the fault, and the distance between the fault location and one of terminal buses of the faulty line segment.

The step 1015 partitions the distribution system into main network and lateral networks through topology analysis, e.g., as shown in FIG. 8. The main network is formed by all available paths between the generation sources, and the terminal buses of the faulty line segment. A lateral network is formed by one of the buses of main network, and all downstream buses and devices connected to the bus.

The step 1020 breaks the loops in lateral networks into radial paths, such that the configuration of the lateral networks is solely radial, as shown in FIG. 9.

The step 1024 determines the nodal admittance model for faulty line segment by merging fault line condition into original nodal admittance model of the fault line. The fault as described in connection with FIG. 4 may be a bolted fault, or an impedance fault.

The step 1028 determines the nodal admittance model for a three-phase jointly-regulated generation source by replacing its three-phase internal bus with an equivalent single-phase bus model, as described in connection with FIG. 6.

The step 1030 merges a zero-impedance branch with adjacent impedance branches into new branches between the master bus of zero-impedance branch and one of adjacent branch bus. The bus of zero-impedance branch close to the fault is considered as the master bus, as described in connection with FIG. 5.

The step 1034 initializes the voltage of each bus based on its controlled zone, as described in connection with FIG. 7. The voltages of buses within the fault controlled zone are initialized with values determined by the type of fault. The voltages of the buses within generation source controlled zones are initialized based on the voltage of generation source and the aggregated voltage amplifying factor matrix introduced by the transformers and regulators on the shortest path from the generation source to the bus of interest.

The step 1038 initializes the loop compensation currents based on the equivalent load currents for the loop, and the impedance matrices of two radial paths for the loop.

The step 1040 determines the equivalent current injections for each bus of lateral networks.

The step 1042 executes a backward sweep for each lateral network to sum up the currents for each bus and branch from the farthest buses and ending at the root, which is one of main network.

The step 1044 determines the equivalent bus currents of the main network by adding downstream currents from the lateral networks fed by the bus with the equivalent currents from loads at the bus.

The step 1046 solve the nodal current injection equations of the main network based on the factorized lower and upper triangular matrices of nodal admittance matrix of the main network, and update the voltages of the main network with the solution.

The step 1048 executes a forward sweep for each lateral network to determine the voltages for each bus starting from the bus of main network at the first layer, and ending at the buses at the farthest layers.

The step 1050 determines the maximum voltage difference between breakpoints for each loop.

The step 1052 tests whether the mismatches are less than given maximum tolerance, and the execution, proceeds to the step 1056, if the mismatches are small enough, or, otherwise, the execution proceeds to the step 1054.

The step 1054 adjusts the compensation currents for lateral loops based on the voltage difference determined in step 1050 and loop impedance matrices, and proceeds to the step 1040.

The step 1056 determines the voltage mismatches for all buses between current iteration and last iteration.

The step 1058 tests whether the voltage mismatches are less than given maximum tolerance, and proceed to step 1060 if mismatches are small enough. Otherwise, proceed to step 1040 to execute next iteration.

The step 1060 determines the voltages for unsolved slave buses of zero-impedance branches, and unsolved phases for jointly-regulated generation source, and the location having the fault.

The step 1070 determines the currents for all buses including two sub-segments of fault line based the full set of voltages for the system.

Although the invention has been described with reference to certain preferred embodiments, it is to be understood that various other adaptations and modifications can be made within the spirit and scope of the invention. Therefore, it is the object of the append claims to cover all such variations and modifications as come within the true spirit and scope of the invention.

The invention claimed is:

1. A method for determining three-phase voltages of buses and three-phase currents of branches of an ungrounded power distribution system in response to detecting a fault occurred along a line segment of the power distribution system by a processor in communication with the power distribution system and a memory embodied thereon instructions of the method executable by the processor for performing the method, comprising:
   providing a normal state topology of the power distribution system from the memory;
   detecting the fault of the line segment of the power distribution system by the processor in communication with the ungrounded power distribution system;
   specifying a type of the fault, a location of the fault and impedances of the fault of the line segment of the ungrounded power distribution system using the normal state topology, wherein the line segment includes a short circuit fault caused between at least one phase to ground or at least two phases;
   selecting, using the type of the fault, a transformation matrix from a predetermined set of transformation matrices;
   determining a faulty nodal admittance matrix of the line segment after the fault using a nodal admittance matrix of the line segment constructed based on the normal state topology, and the transformation matrix corresponding to the type, the location and the impedances of the fault;
   forming a fault controlled zone, and generation source controlled zones for the distribution system, wherein the fault controlled zone includes buses connected to the line segment with non-transformer and non-voltage-regulator branches, and the generation source controlled zone includes all adjacent buses having connections with the generation source, but not in the fault controlled zone;
   initializing the voltages of buses of the fault controlled zone with initial voltages at the fault location determined by the type of the fault and voltages of the buses of the line segment before the fault;
   initializing voltages of the buses in the generation source controlled zone based on voltage amplifier factors of transformers and regulators along paths connecting each bus with the generation source; and
   determining the voltages of buses and currents of branches of the ungrounded power distribution system having the fault on the line segment through a power flow solution of the system using the faulty nodal admittance matrix and nodal admittance matrices of functional branches or line segments of the power distribution system.

2. The method of claim 1, wherein the line segment has a short-circuit fault between a bus p and a bus s, further comprising:
   determining self-admittances and mutual admittances of the faulty nodal admittance matrix according to:

$$Y_{pp} = \frac{Y_{ps}^{se}}{d} + \frac{dY_{ps}^{sh}}{2} - \frac{Y_{ps}^{se}T^T}{d}\left(\frac{TY_{ps}^{se}T^T}{d(1-d)} + \frac{TY_{ps}^{sh}T^T}{2} + Y_f\right)^{-1}\frac{TY_{ps}^{se}}{d},$$

$$Y_{ss} = \frac{Y_{ps}^{se}}{1-d} + \frac{(1-d)Y_{ps}^{sh}}{2} - \frac{Y_{ps}^{se}T^T}{1-d}\left(\frac{TY_{ps}^{se}T^T}{d(1-d)} + \frac{TY_{ps}^{sh}T^T}{2} + Y_f\right)^{-1}\frac{TY_{ps}^{se}}{1-d},$$

$$Y_{ps} = Y_{sp} = -\frac{Y_{ps}^{se}T^T}{d}\left(\frac{TY_{ps}^{se}T^T}{d(1-d)} + \frac{TY_{ps}^{sh}T^T}{2} + Y_f\right)^{-1}\frac{TY_{ps}^{se}}{1-d},$$

wherein $Y_{pp}$ and $Y_{ss}$ are self-admittance matrices at the bus p and the bus s, $Y_{sp}$ is a mutual admittance matrix between the bus p and the bus s, $Y_{sp}$ are a mutual admittance matrix between the bus s and the bus p, $Y_{ps}^{se}$ is an inverse of series impedance matrix of the line segment, $Y_{ps}^{sh}$ is a shunt admittance matrix of the line segment, and d is a ratio of a distance between a location of the fault and the bus p over a length of the line segment, $Y_f$ is a shunt admittance matrix at the fault point, and T is the transformation matrix determined based on the type of the fault.

3. The method of claim 1, further comprising:
   merging a zero-impedance branch with at least one adjacent impedance branch that is furthest from a location of the fault by removing a common bus to form a new impedance branch;
   constructing nodal admittance model for the new impedance branch based on a nodal admittance matrix of the adjacent branch and a voltage and a current amplifying factor matrices of the zero-impedance branch; and
   adding equivalent currents at the common bus to remaining buses of the zero-impedance branch.

4. The method of claim 1, further comprising:
   embedding joint-regulation of three phase voltages of a distributed generation source into a nodal admittance model relating an equivalent phase of an internal bus of the distributed generation source to three phases of an external bus of the distributed generation source; and
   constructing the nodal admittance model for an impedance branch between an equivalent phase of an internal bus of a generation source and the three phases of the external bus based on the equivalent internal impedances of the sources and a rotation matrix defined for rotating the three phases onto the equivalent phase.

5. The method of claim 1, further comprising:
   partitioning the distribution system into a main network and a set of lateral networks according to a location of the fault, and generation sources; and
   determining the voltages of buses of main network and lateral networks iteratively.

6. The method of claim 5, further comprising:
   determining the main network including buses and branches on connectivity paths between the buses of the faulty line segment and the generation sources; and
   determining a nodal admittance matrix for the main network.

7. The method of claim 5, further comprising:
   determining the lateral network to a bus in the main network, and all buses and branches not in the main network but fed by the bus in the main network;
   breaking loops of the lateral network into radial paths, and partitioning a loop downstream currents between two radial paths based on impedance matrices of the radial paths.

8. The method of claim 5, further comprising:
   initializing the voltages of buses of the main network, and lateral networks according to a control zone of each bus; and determining voltages of the buses of the distribution system recursively until a convergence criterion is satisfied, wherein each iteration includes updating the voltages of main network based on the branch currents of the lateral network;

updating the voltages of buses of the lateral network based on the voltages of the corresponding bus of the main network; and updating the branch currents of lateral networks based on the voltages of the buses of the lateral network.

9. The method of claim 8, wherein each iteration comprises:

updating the equivalent currents of buses of the lateral network using a backward sweep;

updating the voltages of the main network by solving incremental current injection equations;

updating the voltages of buses of the lateral network based on the voltages of main network; and adjusting the loop current allocation between the radial paths based on the voltages difference between two breakpoints.

10. The method of claim 8, further comprising:

determining the convergence criteria as a maximum voltage update during a current iteration; and comparing the convergence criteria with a threshold to determine a convergence of the iterations.

11. The method of claim 1, further comprising:

determining voltages for buses of zero-impedance branches that removed from the determination.

12. The method of claim 1, further comprising:

determining currents for all branches including line segments between the fault location and terminal buses of the faulty line segment, based on the determined voltages of the buses.

13. A fault detection system for determining three-phase voltages of buses and three-phase currents of branches of an ungrounded power distribution system in response to detecting a fault occurred along a line segment of the power distribution system, comprising:

a memory for providing a normal state topology of the power distribution system; and a processor in communicating with the power distribution system and the memory, wherein the processor performs steps for:

providing the normal state topology of the power distribution system from the memory;

specifying a type of the fault, a location of the fault and impedances of the fault of the line segment of the ungrounded power distribution system using the normal state topology, wherein the line segment includes a short circuit fault caused between at least one phase to ground or at least two phases;

determining a faulty nodal admittance matrix of the line segment after the fault using a nodal admittance matrix of the line segment based on the normal state topology, and a transformation matrix corresponding to the type, the location and the impedances of the fault;

forming a fault controlled zone, and generation source controlled zones for the distribution system, wherein the fault controlled zone includes buses connected to the line segment with non-transformer and non-voltage-regulator branches, and the generation source controlled zone includes all adjacent buses having connections with the generation source, but not in the fault controlled zone;

initializing the voltages of buses of the fault controlled zone with initial voltages at the fault location determined by the type of the fault and voltages of the buses of the line segment before the fault;

initializing voltages of the buses in the generation source controlled zone based on voltage amplifier factors of transformers and regulators along paths connecting each bus with the generation source; and determining the voltages of buses and currents of branches of the ungrounded power distribution system having the fault on the line segment through a power flow solution of the system using the faulty nodal admittance matrix and nodal admittance matrices of functional branches or line segments of the power distribution system.

14. The fault detection system of claim 13, further comprising:

merging a zero-impedance branch with at least one adjacent impedance branch that is furthest from a location of the fault by removing a common bus to form a new impedance branch;

constructing nodal admittance model for the new impedance branch based on a nodal admittance matrix of the adjacent branch and a voltage and a current amplifying factor matrices of the zero-impedance branch; and adding equivalent currents at the common bus to remaining buses of the zero-impedance branch.

15. The fault detection system of claim 13, further comprising:

embedding joint-regulation of three phase voltages of a distributed generation source into a nodal admittance model relating an equivalent phase of an internal bus of the distributed generation source to three phases of an external bus of the distributed generation source; and constructing the nodal admittance model for an impedance branch between an equivalent phase of an internal bus of a generation source and the three phases of the external bus based on the equivalent internal impedances of the sources and a rotation matrix defined for rotating the three phases onto the equivalent phase.

16. The fault detection system of claim 13, further comprising:

partitioning the distribution system into a main network and a set of lateral networks according to a location of the fault, and generation sources; and determining the voltages of buses of main network and lateral networks iteratively.

17. A non-transitory computer readable medium for determining three-phase voltages of buses and three-phase currents of branches of an ungrounded power distribution system in response to detecting a fault occurred along a line segment of the power distribution system using a processor in communication with the power distribution system and a memory, the medium embodied thereon a program, that when executed by the processor, the program causes, in response to detecting a fault in a line segment from the system, the processor to performs the steps of:

providing a normal state topology of the power distribution system from the medium;

specifying a type of the fault, a location of the fault and impedances of the fault of the line segment of the ungrounded power distribution system using the normal state topology, wherein the line segment includes a short circuit fault caused between at least one phase to ground or at least two phases;

determining a faulty nodal admittance matrix of the line segment after the fault using a nodal admittance matrix of the line segment based on the normal state topology stored in the memory, and a transformation matrix corresponding to the type, the location and the impedances of the fault;

forming a fault controlled zone, and generation source controlled zones for the distribution system, wherein the fault controlled zone includes buses connected to the line segment with non-transformer and non-voltage-regulator branches, and the generation source controlled zone includes all adjacent buses having connections with the generation source, but not in the fault controlled zone;

initializing the voltages of buses of the fault controlled zone with initial voltages at the fault location determined by the type of the fault and voltages of the buses of the line segment before the fault;

initializing voltages of the buses in the generation source controlled zone based on voltage amplifier factors of transformers and regulators along paths connecting each bus with the generation source; and determining the voltages of buses and currents of branches of the ungrounded power distribution system having the fault on the line segment through a power flow solution of the system using the faulty nodal admittance matrix and nodal admittance matrices of functional branches or line segments of the power distribution system.

18. The non-transitory computer readable medium of claim 17, further comprising:

merging a zero-impedance branch with at least one adjacent impedance branch that is furthest from a location of the fault by removing a common bus to form a new impedance branch;

constructing nodal admittance model for the new impedance branch based on a nodal admittance matrix of the adjacent branch and a voltage and a current amplifying factor matrices of the zero-impedance branch; and adding equivalent currents at the common bus to remaining buses of the zero-impedance branch.

19. The non-transitory computer readable medium of claim 17, further comprising:

embedding joint-regulation of three phase voltages of a distributed generation source into a nodal admittance model relating an equivalent phase of an internal bus of the distributed generation source to three phases of an external bus of the distributed generation source; and constructing the nodal admittance model for an impedance branch between an equivalent phase of an internal bus of a generation source and the three phases of the external bus based on the equivalent internal impedances of the sources and a rotation matrix defined for rotating the three phases onto the equivalent phase.

20. The non-transitory computer readable medium of claim 17, further comprising:

partitioning the distribution system into a main network and a set of lateral networks according to a location of the fault, and generation sources; and determining the voltages of buses of main network and lateral networks iteratively.

* * * * *